(12) United States Patent
Song

(10) Patent No.: US 8,421,099 B2
(45) Date of Patent: Apr. 16, 2013

(54) LIGHT EMITTING DEVICE, LIGHT EMITTING DEVICE PACKAGE, AND DISPLAY DEVICE

(75) Inventor: Hyun Don Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/180,418

(22) Filed: Jul. 11, 2011

(65) Prior Publication Data

US 2012/0012869 A1 Jan. 19, 2012

(30) Foreign Application Priority Data

Jul. 13, 2010 (KR) .................. 10-2010-0067403

(51) Int. Cl.
*H01L 33/00* (2010.01)
(52) U.S. Cl.
USPC .............. 257/91; 257/92; 257/93; 257/98; 257/E33.061
(58) Field of Classification Search ............. 257/91–98, 257/E33.061, E33.056, E33.073
See application file for complete search history.

(56) References Cited

U.S. PATENT DOCUMENTS

| | | | | |
|---|---|---|---|---|
| 4,612,268 A * | 9/1986 | Miura et al. | | 430/28 |
| 6,720,584 B2 * | 4/2004 | Hata et al. | | 257/98 |
| 6,952,025 B2 * | 10/2005 | Kamemura et al. | | 257/98 |
| 6,956,245 B2 * | 10/2005 | Senda et al. | | 257/94 |
| 7,260,123 B2 * | 8/2007 | Sato | | 372/22 |
| 7,282,748 B2 * | 10/2007 | Takeda et al. | | 257/98 |
| 7,352,011 B2 * | 4/2008 | Smits et al. | | 257/99 |
| 7,390,684 B2 * | 6/2008 | Izuno et al. | | 438/29 |
| 7,420,221 B2 * | 9/2008 | Nagai | | 257/98 |
| 7,488,613 B2 * | 2/2009 | Kunisato et al. | | 438/47 |
| 7,675,075 B2 * | 3/2010 | Nagai | | 257/90 |
| 7,692,204 B2 * | 4/2010 | Stein et al. | | 257/98 |
| 7,723,738 B2 * | 5/2010 | Nakashima et al. | | 257/91 |
| 7,829,909 B2 * | 11/2010 | Yoo | | 257/99 |
| 7,923,741 B1 * | 4/2011 | Zhai et al. | | 257/98 |
| 8,063,410 B2 * | 11/2011 | Fudeta | | 257/98 |
| 8,093,615 B2 * | 1/2012 | Kim et al. | | 257/99 |
| 8,183,588 B2 * | 5/2012 | Edmond et al. | | 257/98 |
| 2002/0063301 A1 * | 5/2002 | Hanamoto et al. | | 257/432 |
| 2002/0074558 A1 * | 6/2002 | Hata et al. | | 257/89 |
| 2002/0088985 A1 * | 7/2002 | Komoto et al. | | 257/99 |
| 2002/0125821 A1 * | 9/2002 | Steckl et al. | | 313/506 |
| 2002/0131462 A1 * | 9/2002 | Lin et al. | | 372/43 |
| 2003/0062530 A1 * | 4/2003 | Okazaki et al. | | 257/79 |
| 2004/0211968 A1 * | 10/2004 | Lin et al. | | 257/81 |
| 2005/0104080 A1 * | 5/2005 | Ichihara et al. | | 257/98 |
| 2005/0158902 A1 * | 7/2005 | Chua et al. | | 438/32 |
| 2005/0236636 A1 * | 10/2005 | Hon et al. | | 257/99 |
| 2007/0019416 A1 * | 1/2007 | Han et al. | | 362/307 |
| 2007/0023777 A1 * | 2/2007 | Sonobe et al. | | 257/103 |
| 2007/0145397 A1 * | 6/2007 | DenBaars et al. | | 257/98 |
| 2007/0176193 A1 * | 8/2007 | Nagai | | 257/98 |
| 2007/0176196 A1 * | 8/2007 | Kim et al. | | 257/99 |

(Continued)

*Primary Examiner* — Kyoung Lee
*Assistant Examiner* — Ankush Singal
(74) *Attorney, Agent, or Firm* — KED & Associates LLP

(57) ABSTRACT

A light emitting device is provided that includes a light emitting structure including a first semiconductor layer, an active layer and a second semiconductor layer, with a roughness formed in a surface of the first semiconductor layer; a phosphor layer arranged on the first semiconductor layer; and an adhesive activation layer arranged between the first semiconductor layer and the phosphor layer. The adhesive activation layer fills a concave part of the roughness and a boundary surface between the adhesive activation layer and the phosphor layer is level.

20 Claims, 13 Drawing Sheets

U.S. PATENT DOCUMENTS

| | | | |
|---|---|---|---|
| 2007/0284598 A1* | 12/2007 | Shakuda et al. | 257/93 |
| 2008/0111950 A1* | 5/2008 | Hong | 349/65 |
| 2008/0128730 A1* | 6/2008 | Fellows et al. | 257/98 |
| 2008/0203416 A1* | 8/2008 | Konishi et al. | 257/98 |
| 2008/0246017 A1* | 10/2008 | Gillies et al. | 257/13 |
| 2009/0127575 A1* | 5/2009 | Horng et al. | 257/98 |
| 2009/0146165 A1* | 6/2009 | Hasnain et al. | 257/98 |
| 2009/0261372 A1* | 10/2009 | Ueda | 257/98 |
| 2009/0261708 A1* | 10/2009 | Moseri et al. | 313/501 |
| 2010/0032701 A1* | 2/2010 | Fudeta | 257/98 |
| 2010/0051982 A1* | 3/2010 | Lin et al. | 257/98 |
| 2010/0053930 A1* | 3/2010 | Kim et al. | 362/84 |
| 2010/0059781 A1* | 3/2010 | Yokobayashi et al. | 257/98 |
| 2011/0013110 A1* | 1/2011 | Kang et al. | 349/58 |
| 2011/0140152 A1* | 6/2011 | Song | 257/98 |
| 2011/0193123 A1* | 8/2011 | Moon et al. | 257/98 |
| 2011/0220942 A1* | 9/2011 | Choi et al. | 257/98 |
| 2012/0138988 A1* | 6/2012 | Lee et al. | 257/98 |

* cited by examiner

LIGHT EMITTING DEVICE, LIGHT EMITTING DEVICE PACKAGE, AND DISPLAY DEVICE

CROSS REFERENCE TO RELATED APPLICATION

This application claims priority under 35 U.S.C.§119 to Korea Application No 10-2010-0067403, filed in Korea on 13 Jul. 2010, which is hereby incorporated in its entirety by reference as if fully set forth herein.

TECHNICAL FIELD

The embodiment relates to a light emitting device and a light emitting device package.

BACKGROUND

To apply a light emitting device for lighting, a white light has to be gained by using an LED. There may be three well known methods to realize a white semiconductor light emitting device.

The first method realizes a white light by combining three light emitting diodes (LED) which emit three primary colors of red, green and blue colors. The second method realizes the white light by excitation of three primary color phosphors, using an ultraviolet LED as lighting source, and it uses R, G, and B phosphors as light emitting materials. The third method realizes the white light by excitation of a yellow phosphor, using a blue LED as lighting source and it generally uses YAG:Ce phosphor as light emitting material.

SUMMARY

Accordingly, the embodiment is directed to a light emitting device and a light emitting device package. An object of the embodiment is to provide a light emitting device which can prevent a phosphor layer from being peeled off, and a light emitting device package.

A light emitting device includes a light emitting structure comprising a first semiconductor layer, an active layer and a second semiconductor layer, with an roughness formed in a surface of the first semiconductor layer; a phosphor layer arranged on the first semiconductor layer; and an adhesive activation layer arranged between the first semiconductor layer and the phosphor layer, wherein the adhesive activation layer fills a concave part of the roughness and a boundary surface between the adhesive activation layer and the phosphor layer is level. The adhesive activation layer may be formed of an oxide based material or a nitride based material. The light emitting device may further include a second electrode layer arranged under the light emitting structure. The second electrode layer may include a supporting member; a reflective layer arranged on the supporting member; and an ohmic contact layer located between the reflective layer and the light emitting structure. The light emitting device may further include a first electrode arranged on the first semiconductor layer. The adhesive activation layer may be lower than the first electrode. The thickness of the adhesive activation layer from a convex part of the roughness may be 5000 Å~1 µm. The thickness of the adhesive activation layer from a concave part of the roughness may be 1 um~3 um. An upper surface of the phosphor layer may be higher than an upper surface of the first electrode. The phosphor layer may be a conformal coating layer. The light emitting device may further include a passivation layer covering a side surface of the light emitting structure. The phosphor layer may cover a predetermined region of the upper surface of the first electrode. The first semiconductor layer may be an n-type nitride semiconductor layer and the second semiconductor layer may be a p-type nitride semiconductor layer.

A predetermined region of the second semiconductor layer may be exposed and the light emitting device may further include a substrate located under the second semiconductor layer; a conductive layer arranged between the first semiconductor layer and the adhesive activation layer; a first electrode arranged on the exposed second semiconductor layer; and a second electrode arranged on the conductive layer. The phosphor layer may be arranged on the exposed second semiconductor layer and the adhesive activation layer may be interposed between the exposed second semiconductor layer and the phosphor layer. The adhesive activation layer may be lower than the first and second electrodes, and the phosphor layer may partially cover upper surfaces of the first and second electrodes. The adhesive activation layer may be $SiO_2$, $Si_3N_4$, $Al_2O_3$ or $MgFe_2$.

In another aspect of the embodiment, a light emitting device package includes a package body; first and second metal layers arranged on the package body, electrically separated from each other; a light emitting device electrically connected with the first and second metal layers; and an encapsulation layer encapsulating the light emitting device, wherein the light emitting device includes a light emitting structure comprising a first semiconductor layer, an active layer and a second semiconductor layer, with an roughness formed in a surface of the first semiconductor layer; a phosphor layer arranged on the first semiconductor layer; and an adhesive activation layer arranged between the first semiconductor layer and the phosphor layer, the adhesive activation layer filling a concave part of the roughness, with a boundary surface between the adhesive activation layer and the phosphor layer being level.

In a further aspect of the embodiment, a display device includes a display panel; and a backlight unit emitting a light to the display panel, the backlight unit including a bottom cover; a reflection sheet arranged on the bottom cover; a light guide plate arranged on the reflection sheet; a lighting source emitting a light to the light guide plate, the lighting source comprising a light emitting device packages arranged on a substrate; and an optical sheet arranged on the light guide plate, wherein each of the light emitting device packages includes a package body; first and second metal layers arranged on the package body, electrically separated from each other; a light emitting device electrically connected with the first and second metal layers; and an encapsulation layer encapsulating the light emitting device, and wherein the light emitting device includes a light emitting structure comprising a first semiconductor layer, an active layer and a second semiconductor layer, with an roughness formed in a surface of the first semiconductor layer; a phosphor layer arranged on the first semiconductor layer; and an adhesive activation layer arranged between the first semiconductor layer and the phosphor layer, the adhesive activation layer filling a concave part of the roughness, with a boundary surface between the adhesive activation layer and the phosphor layer being level.

According to the light emitting device and a light emitting device package, the phosphor layer provided in the light emitting device may be prevented from being peeled off effectively.

It is to be understood that both the foregoing general description and the following detailed description of the embodiment are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Figure 1:
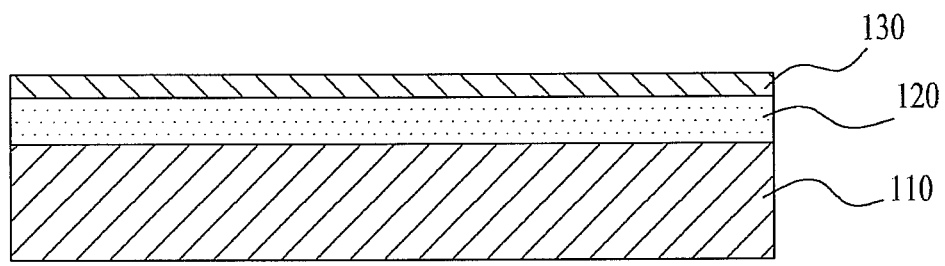
FIG. 1 is a diagram illustrating a light emitting structure of a light emitting device according to an embodiment of the embodiment.

As follows, exemplary embodiments of the embodiment capable of embodying the object of the embodiment will be described in reference to the accompanying drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

The thickness and size of each layer may be exaggerated, emitted or illustrated schematically in the drawings, for explanation and precision. The size of each component shown in the drawings may not reflect the actual size completely. As follows will be described a light emitting device, a method of fabricating the light emitting device and a light emitting device package according to embodiments of the embodiment in detail in reference to the accompanying drawings.

The light emitting device according to embodiments has a structure configured of a semiconductor layer for generating a light, a phosphor layer for varying a wavelength of the generated light and a nitride or oxide based adhesive activation layer insertedly arranged between the semiconductor layer and the phosphor layer. At this time, the adhesive activation layer may improve adhesion between a surface of the semiconductor layer and an interface of the phosphor layer.

FIG. 1 illustrates a light emitting structure 110, an adhesive activation layer 120 and a phosphor layer 130 provided in the light emitting device according to the embodiment. In reference to FIG. 1, the light emitting device has the structure configured of the adhesive activation layer 120 inserted between the light emitting structure 110 and the phosphor layer 130. Here, the adhesive activation layer 120 is employed to increase adhesion between the light emitting structure 110 and the phosphor layer 130. At this time, the light emitting structure 110 may be a nitride based semiconductor layer and the adhesive activation layer 120 may be a nitride or oxide based material. For example, the adhesive activation layer 120 may be $SiO_2$, $SiO_x$, $SiO_xN_y$, $Si_3N_4$, or $Al_2O_3$.

The light emitting structure 110 may be configured of a first conductivity type semiconductor layer, an active layer and a second conductivity type semiconductor layer which are multilayered sequentially. The second conductivity type may be p-type and the first conductivity type may be n-type, and vice versa. At this time, a surface of the first conductivity or second conductivity type semiconductor layer may be a light extraction surface.

The light emitting structure 110 generates a light. The phosphor layer 130 absorbs the generated light and it changes a wavelength of the absorbed light, to emit the light. The adhesive activation layer 120 located between the light emitting structure 110 and the phosphor layer 130 improves adhesion between interfaces of the light emitting structure 110 and the phosphor layer 130, to prevent the phosphor layer from being peeled off. Also, the adhesive activation layer 120 reduces an air gap of the phosphor layer 130 generated by the light emitting structure, for example, an irregular roughness formed in a surface of a second conductivity type semiconductor layer, to prevent lights from being lost in an excitation process. At this time, the intensity of the lights excited by the phosphor layer 130, for example, a yellow phosphor layer may be increased according to physical properties of the adhesive activation layer 120.

Figure 2:
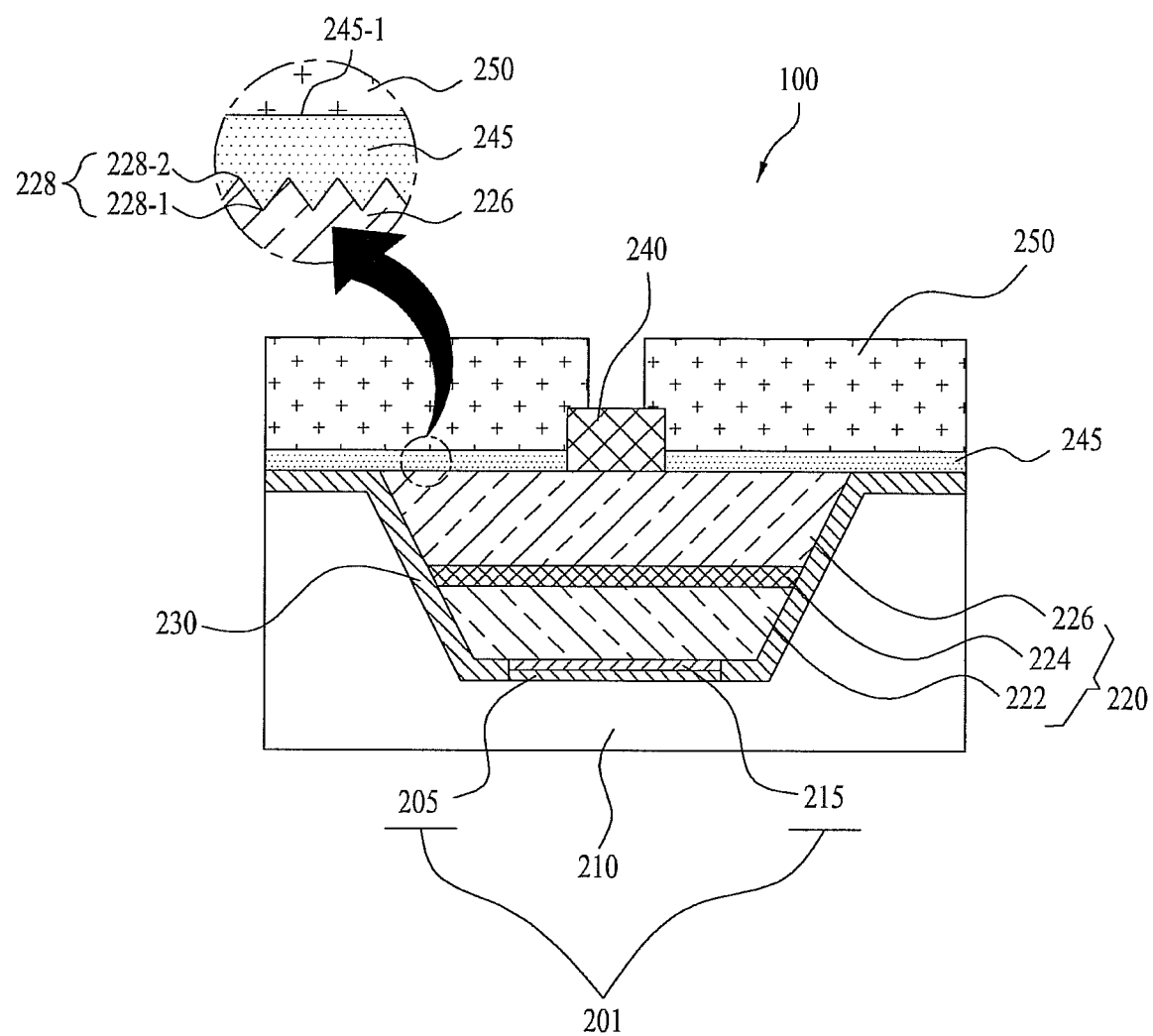
FIG. 2 is a diagram illustrating a vertical type light emitting device according to an embodiment.

FIG. 2 illustrates the light emitting device 100 according to the embodiment. In reference to FIG. 2, the light emitting device 100 includes a second electrode layer 201, a light emitting structure 220, a passivation layer 230, a first electrode 240, an adhesive activation layer 245 and a phosphor layer 250.

The second electrode layer 201 includes a supporting member 210, a reflective layer 205 and an ohmic contact layer 215.

The supporting member 210 may be formed of a metal substrate or a semiconductor. For example, the supporting member 210 may include a metal material including at least one of Cu, Cr, Ni, Ag, Au, Pd, W and Al or at least one of Si, Ge, GaAs, ZnO and SiC.

The reflective layer 205 is located on the supporting member 210 to reflect a light incident thereon from the light emitting structure 220 to enhance light extraction efficiency. The reflective layer 205 may be found of Au, Ni, Ag, Al and alloy of them.

The ohmic contact layer 215 is located between the reflective layer 205 and the light emitting structure 220, and it is in ohmic contact with the light emitting structure 220 to allow the electric power supplied to the light emitting structure 220 smoothly. A transparent conductivity layer or a metal may be used to form the ohmic contact layer 215. For example, the ohmic contact layer 215 may be configured of a single layer or multi-layers, using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au and Ni/$IrO_x$/Au/ITO.

The light emitting structure 220 is a multilayered structure having a second conductivity type semiconductor layer 22, an active layer 224 and a first conductivity type semiconductor layer 226 which are multilayered sequentially. At this time, the second conductivity type is a p-type and the first conductivity type is an n-type, and vice versa.

The second conductivity type semiconductor layer 222 is located on the reflective layer 205 and it is a semiconductor having an empirical formula, for example, $In_xAl_yGa_{1-x-y}N$ ($0 \leq x \leq 1$, $0 \leq y \leq 1$, $0 \leq x+y \leq 1$). A p-type dopant such as Mg, Zn, Ca, Sr and Ba may be doped on the second conductivity type semiconductor layer 222. For example, the second conductivity type semiconductor layer 222 may be a semiconductor layer formed of a Nitride based material selected from InAlGaN, GaN, AlGaN, InGaN, AlN, InN and AlInN.

The active layer 224 is located on the second conductivity type semiconductor layer 222 and it may be a 3-5 group atom compound semiconductor material, having at least one of quantum wire, quantum dot, single-quantum well and multi-quantum well structure.

For example, when it has the multi-quantum well structure, the active layer 224 may have a single or multi quantum well structure including a well layer with an empirical formula: $In_xAl_yGa_{1-x-y}N$ ($0 \leq x \leq 1$, $0 \leq y \leq 1$, $0 \leq x+y \leq 1$) and a barrier layer with an empirical formula: $In_aAl_bGa_{1-a-b}N$ ($0 \leq a \leq 1$, $0 \leq b \leq 1$, $0 \leq a+b \leq 1$). The well layer may be formed of a predetermined material having a lower band gap than an energy gap of a barrier layer.

The active layer 224 may generate a light by using an energy generated during the recombination of the holes and electrons supplied by the second conductivity type semiconductor layer 222 and the first conductivity type semiconductor layer 226.

The first conductivity type semiconductor layer 226 is located on the active layer 224 and it is a nitride based semiconductor, for example, a semiconductor having an empirical formula: $In_xAl_yGa_{1-x-y}N$ ($0 \leq x \leq 1$, $0 \leq y \leq 1$, $0 \leq x+y \leq 1$). An n-type dopant such as Si, Ge and Sn may be doped on the first conductivity type semiconductor layer 226. For example, the first conductivity type semiconductor layer 226 may be one of InAlGaN, GaN, AlGaN, InGaN, AlN, InN and AlInN.

The light emitting structure 220 may include an n-type semiconductor layer located under the second conductivity type semiconductor layer 222. For example, the light emitting structure 220 may include at least one of an N-P junction structure, an N-P-N junction structure and a P-N-P junction structure.

The first conductivity type semiconductor layer 226 may have roughness 228 formed on a surface thereof to enhance light extraction efficiency. At this time, the roughness 228 may be a regularly or irregularly uneven shape.

The passivation layer 230 covers side surfaces of the light emitting structure 220 to protect the light emitting structure 220 electrically. For example, the passivation layer 230 may cover side surfaces of the reflective layer 205, side surfaces of the ohmic contact layer 215 and side surfaces of the light emitting structure 220. The passivation layer 230 may be farmed of a silicon oxide layer, a silicon nitride layer or AlN. For example, the passivation layer 230 may be formed of $SiO_2$, $SiO_x$, $SiO_xN_y$, $Si_3N_4$ or $Al_2O_3$.

The first electrode 240 is located in a predetermined region of the surface of the first conductivity type semiconductor layer 226 (that is, a predetermined region of a light extraction surface).

The adhesive activation layer 245 is arranged in the other region of the first conductivity type semiconductor layer 226, except the region where the first electrode 240 is located. For example, the adhesive activation layer 245 may be arranged in the other region except the region of the first conductivity type semiconductor layer 226 where the first electrode 240 is located.

The adhesive activation layer 245 may be an oxide or nitride layer formed of a nitride or oxide based material. For example, the adhesive activation layer 245 may be formed of $SiO_2$, $Si_3N_4$, $Al_2O_3$ or $MgFe_2$.

The adhesive activation layer 245 may be formed lower than an upper surface of the first electrode 240. For example, the thickness (or height) of the first electrode 240 may be 3 μm or less and the thickness of the adhesive activation layer 245 from a convex part of the roughness 228 may be 5000 Å~1 μm. in The thickness of the adhesive activation layer 245 from a concave part of the roughness 228 may be 1 um~3 um. If the thickness of the adhesive activation layer 245 is too large, influence of stress generated by the adhesive activation layer 245 may increase.

Figure 7:
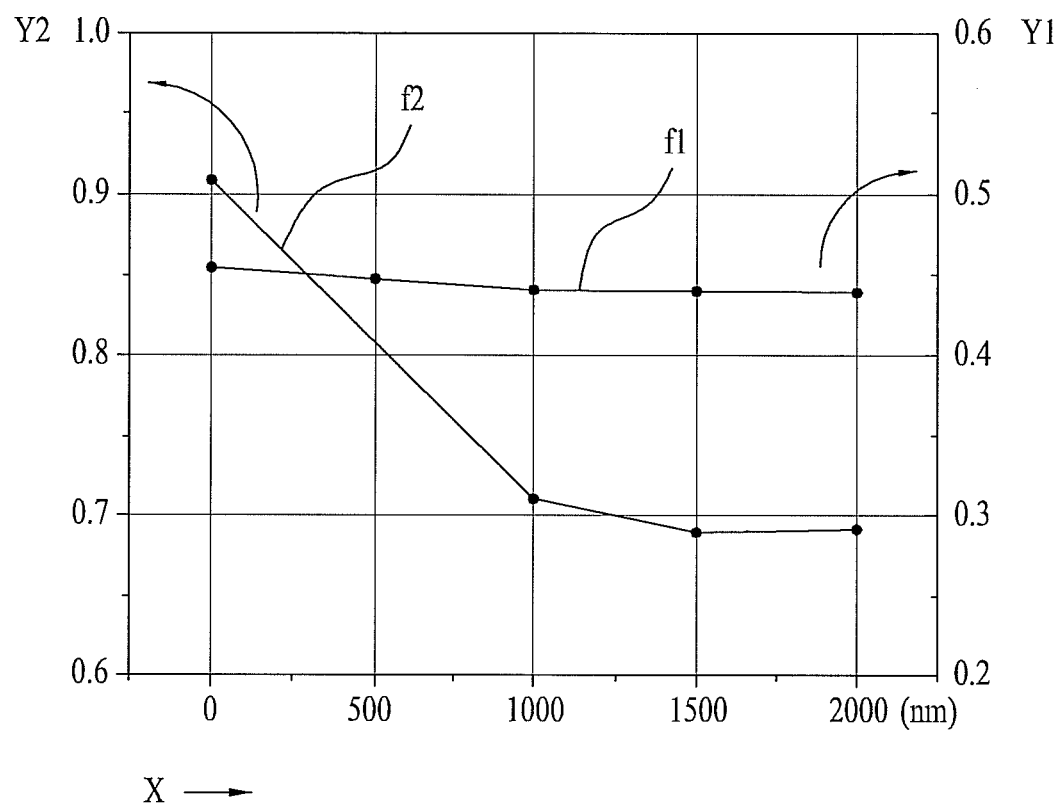
FIG. 7 is a diagram illustrating re-absorption efficiency and light extraction efficiency based on the thickness of the adhesive activation layer shown in FIG. 2.

FIG. 7 illustrates re-absorption efficiency and light extraction efficiency based on the thickness of the adhesive activation layer shown in FIG. 2.

f1 refers to light extraction efficiency from the light emitting structure 220 to the phosphor layer 250. When the light extracted from the light emitting structure 220 is supplied to the phosphor layer 250, the phosphor layer 250 performs yellow emission by using the extracted light as excitation energy. f2 refers to efficiency of re-absorption of yellow emission to the light emitting structure 220.

'X' axis refers to the thickness of the adhesive activation layer 245 and 'Y1' axis refers to light extraction efficiency with respect to the f1 and 'Y2' refers to re-absorption efficiency with respect to the f2.

In reference to the f1, luminous efficiency of the lights extracted to the phosphor layer 250 from the light emitting structure 220 is maintained uniformly, not decreased, even when the thickness of the adhesive activation layer 245 is increasing. Especially, even when the thickness of the adhesive activation layer 245 is 1 um or more, it is shown that the light extraction efficiency is hardly decreased by dispersion, re-reflection or re-absorption of the adhesive activation layer 245.

In reference to the f2, re-absorption efficiency of the yellow emission is decreasing as the thickness of the adhesive activation layer 245 is increasing. Especially, when the thickness of the adhesive activation layer 245 is 1 um or more, it is shown that re-absorption efficiency is decreasing noticeably.

As a result, when the thickness of the adhesive activation layer 245 is 1 um or more, the re-absorption efficiency of the yellow emission generated from the phosphor layer 250 is decreasing. Because of that, white conversion efficiency may increase. Also, even if the thickness of the adhesive activation layer 245 is increased up to more than 1 um, the light extraction efficiency of the light emitting structure may not decrease.

The roughness 228 formed on the surface of the first conductivity type semiconductor layer 226 may include a concave part 228-1 and a convex part 228-2. The adhesive activation layer 245 fills the concave part 228-1 (or an air gap) of the roughness 228 formed on the surface of the first conductivity type semiconductor layer 226, to sooth the roughness 228 of the first conductivity type semiconductor layer 226. An upper surface of the adhesive activation layer 245 formed on the first conductivity type semiconductor layer 226 may be level and the reason why the upper surface is level will be described layer in reference to FIGS. 6a and 6b.

The phosphor layer 250 may be arranged on the adhesive activation layer 245 and it may be a conformal coating layer.

Also, an upper surface of the phosphor layer 250 formed on the adhesive activation layer 245 may be level, because the upper surface of the adhesive activation layer 245 is level, and a boundary surface 245-1 between the adhesive activation layer 245 and the phosphor layer 250 may be level.

As a result, the phosphor layer 250 coated on the adhesive activation layer 245 is not affected by the roughness 288 of the first conductivity type semiconductor layer 226. Because of that, air gap generation on the surface of the phosphor layer 245 may be reduced and the phosphor layer 250 may have a level and smooth surface.

The upper surface of the phosphor layer 250 may be formed higher than an upper surface of the first electrode 240 and it may be formed to cover the top surface of the first electrode 240 partially. The phosphor layer 250 may include at least one of blue, green and yellow phosphors.

According to the light emitting device 100 according to the embodiment shown in FIG. 2, the adhesive activation layer 245 insertedly located between the first conductivity type semiconductor layer 226 and the phosphor layer 250 may increase adhesion of two interfaces of the first conductivity type semiconductor layer 226 and the phosphor layer 250, such that the phosphor layer may be prevented from peeling off.

Moreover, the phosphor layer 250 coated on the adhesive activation layer 245 has the surface of which air gap generation is reduced. Because of that, the light emitting device according to this embodiment may reduce light loss which might be generated in the excitation process and increase the intensity of the lights excitated by the phosphor layer 250 based on physical properties of the adhesive activation layer.

Figure 3:
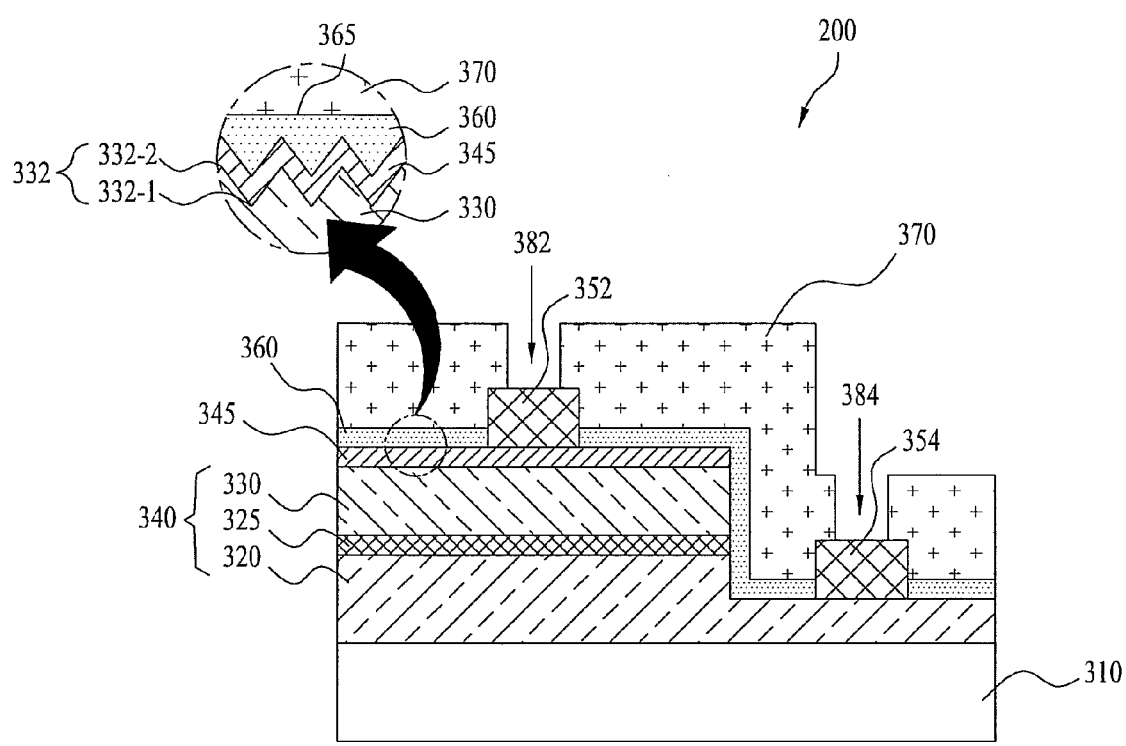
FIG. 3 is a diagram illustrating a horizontal type light emitting device according to an embodiment.

FIG. 3 illustrates a light emitting device 200 according to another embodiment. In reference to FIG. 3, the light emitting device 200 includes a light emitting structure 340 formed on a substrate 310, a conductive layer 345, a first electrode 352, a second electrode 354, an adhesive activation layer 360 and a phosphor layer 370.

The substrate 310 may be a sapphire substrate, a silicon (Si) substrate, a zinc oxide (ZnO) substrate, a SiC substrate, a Ga2O3 substrate or a nitride substrate, or it may be a template substrate on which at least one of GaN, InGaN, AlGaN and AlInGaN is multilayered.

The light emitting structure 340 is a multilayered structure having a first conductivity type semiconductor layer 320, an active layer 325 and a second conductivity type semiconductor layer 330 multilayered on the substrate 310 sequentially. At this time, a semiconductor layer(not shown) having no impurity doped thereon, for example, undoped GaN may be interposed between the first conductivity type semiconductor layer 320 and the substrate 310. Here, the first conductivity type may be n-type and the second conductivity type may be p-type.

The first conductivity type semiconductor layer 320 may be a nitride based semiconductor, for example, a semiconductor having an empirical formula: $In_xAl_yGa_{1-x-y}N$ ($0 \leq x \leq 1$, $0 \leq y \leq 1$, $0 \leq x+y \leq 1$). An n-type dopant such as Si, Ge and Sn may be doped on the first conductivity type semiconductor layer 320. For example, the first conductivity type semiconductor layer 320 may be formed of one selected from InAlGaN, GaN, AlGaN, InGaN, AlN and InN, and an n-type dopant such as Si, Ge and Sn may be doped on the first conductivity type semiconductor layer 320.

The active layer 325 may a single-Quantum Well or multi-Quantum Well structure. When it has the quantum well structure, the active layer 325 may have a single or multi quantum well structure including a well layer with an empirical formula: $In_xAl_yGa_{1-x-y}N$ ($0 \leq x \leq 1$, $0 \leq y \leq 1$, $0 \leq x+y \leq 1$ and a barrier layer with an empirical formula: $In_aAl_bGa_{1-a-b}N$ ($0 \leq a \leq 1$, $0 \leq b \leq 1$, $0 \leq a+b \leq 1$). The well layer may be formed of a predetermined material having a lower band gap than an energy gap of a barrier layer.

The second conductivity type semiconductor layer 330 may be a nitride based semiconductor, for example, a semiconductor having an empirical formula: $In_xAl_yGa_{1-x-y}N$ ($0 \leq x \leq 1$, $0 \leq y \leq 1$, $0 \leq x+y \leq 1$). A p-type dopant such as Mg, Zn, Ca, Sr and Ba may be doped on the second conductivity type semiconductor layer 330. For example, the second conductivity type semiconductor layer 330 may be formed of one selected from InAlGaN, GaN, AlGaN, InGaN, AlN, InN and AlInN and the p-type dopant (for example, Mg, Zn, Ca, Sr and Ba) may be doped on the second conductivity type semiconductor layer 330.

The light emitting structure 340 may be a structure having the second conductivity type semiconductor layer 330, the active layer 325 and the first conductivity type semiconductor layer 320 to have predetermined etched regions, respectively, to expose the first conductivity type semiconductor layer 320 partially. At this time, the partial etching performed to the first conductivity type semiconductor layer 320 may be referenced to as 'mesa etching'. The region of the first conductivity type semiconductor layer 320 exposed by the mesa etching may be referenced to as 'etched region'.

The conductive layer 345 may be arranged on a surface of the second conductivity type semiconductor layer 330 and it may be transparent. For example, the conductive layer 345 may be arranged on the surface of the second conductivity type semiconductor layer 330 which is not etched by the mesa etching.

The conductive layer 345 may reduce full reflection, and it may increase extraction efficiency of the lights emitted toward the second conductivity type semiconductor layer 330 from the active layer 325 because of its excellent transparency.

For example, the conductive layer 345 may be formed of at least one of indium tin oxide (ITO), tin oxide (TO), indium zinc oxide (IZO), indium tin zinc oxide (ITZO) and zinc oxide (ZnO). The conductive layer 345 is provided to improve light extraction and it may be not provided in other embodiments accordingly.

The first electrode 345 is arranged on the etched region and the second electrode 352 is arranged on a predetermined region of a surface of the conductive layer 345.

The adhesive activation layer 260 is arranged on the conductive layer 345 and it covers the other surface region of the conductive layer 345 except the region where the second electrode 352 is located.

The adhesive activation layer 360 may be an oxide layer or a nitride layer. For example, the adhesive activation layer 360 may be formed of $SiO_2$, $Si_3N_4$, $Al_2O_3$ or $MgFe_2$.

The adhesive activation layer 360 may be formed lower than an upper surface of the second electrode 352 and the height of the adhesive activation layer 360 may be smaller than the height of the second electrode 352.

The adhesive activation layer 260 may be arranged on an area of the first conductivity type semiconductor layer 320 and side surfaces 341 of the light emitting structure 340, which is exposed by the mesa etching respectively. An upper surface of the adhesion may be formed lower than the upper surface of the first electrode 352. The height of the adhesive activation layer 360 may be smaller than the height of the first electrode 352.

The phosphor layer 370 may be arranged on a surface of the adhesive activation layer 360. The phosphor layer 370 may be a conformal coating layer. Also, the phosphor layer 370 exposes an upper surface of the second electrode 352 and the upper surface of the first electrode 354. The phosphor layer 370 may be formed to cover the upper surfaces of the first and second electrodes 352 and 354 partially.

The phosphor layer 370 arranged on the surface of the adhesive activation layer 360 located on the conductive layer 345 may be formed higher than the second electrode 352, and the phosphor layer 370 arranged on the surface of the adhesive activation layer 360 located on the exposed first conductivity type semiconductor layer 354 may be formed higher than the first electrode 354.

The second conductivity type semiconductor layer 330 may have a roughness 332 formed on a surface thereof, to improve light extraction efficiency. At this time, the roughness 228 may be a regularly or irregularly roughness. The roughness 332 may include a concave part 228-1 and a convex part 228-2.

The conductive layer 345 may have also a regular or irregular roughness formed on a surface thereof, because it is formed on the surface of the second conductivity type semiconductor layer 330 where the roughness 332 is formed.

The adhesive activation layer 360 fills an air gap formed in the surface of the conductive layer 345. Because of that, roughness generated in the surface of the conductive layer 345 may be smoothed. In other words, the surface of the adhesive activation layer 360 formed on the conductive layer 345 may be level.

The phosphor layer 370 may have also the level surface, because it is coated on the level surface of the adhesive activation layer 360. A boundary surface between the adhesive activation layer 360 and the phosphor layer 370 may be level.

As a result, the phosphor layer 370 coated on the adhesive activation layer 360 may not be affected by the roughness formed in both of the second conductivity type semiconductor layer 330 and the conductive layer 345. Because of that, the air gap generation may be reduced enough to make the surface of the phosphor layer 370 level and smooth.

According to the light emitting device 200, the adhesive activation layer 360 insertedly located between the conductive layer 345 and the phosphor layer 370 may increase adhesion between the phosphor layer 370 and the conductive layer 345, such that the phosphor layer 370 may be prevented from peeling off.

Moreover, the phosphor layer 370 coated on the adhesive activation layer 360 has the surface of which air gap generation is reduced. Because of that, the light emitting device according to this embodiment may reduce light loss which might be generated in the excitation process and increase the intensity of the lights excited by the phosphor layer 370 based on physical properties of the adhesive activation layer 360.

FIGS. 4a to 4f illustrate a method of fabricating a light emitting device according to an embodiment.

Figure 4A:
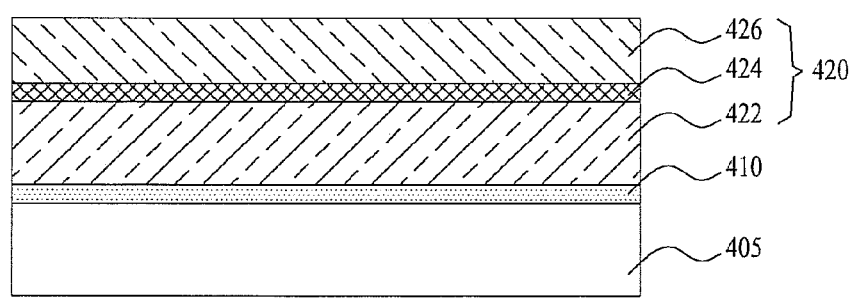
FIGS. 4a through 4f are diagrams illustrating a method of fabricating the vertical type light emitting device according to an embodiment.

As shown in FIG. 4a, on a substrate 405 formed a light emitting structure 420 including a first conductivity type semiconductor layer 422, an active layer 424 and a second conductivity type semiconductor layer 426 which are multi-layered sequentially. At this time, a buffer layer and/or a semiconductor layer 410 having no impurity doped thereon may be formed between the substrate 405 and the first conductivity type semiconductor layer 422 to reduce a difference between lattice constants.

The light emitting structure 420 may be formed in various deposition and growth methods including metal organic chemical vapor deposition (MOCVD), chemical vapor deposition (CVD), plasma-enhanced chemical vapor deposition (PCVD), molecular beam epitaxy (MBE) and hydride vapor phase epitaxy (HVPE). At this time, the growing light emitting structure 420 may be a nitride based material, for example, gallium nitride (GaN).

For example, the first conductivity type semiconductor layer 422 may be n-GaN and the active layer 424 may be a single or multi quantum well structure, using a GaN based material such as GaN or InGaN. The second conductivity type semiconductor layer 426 may be p-GaN.

Figure 4B:
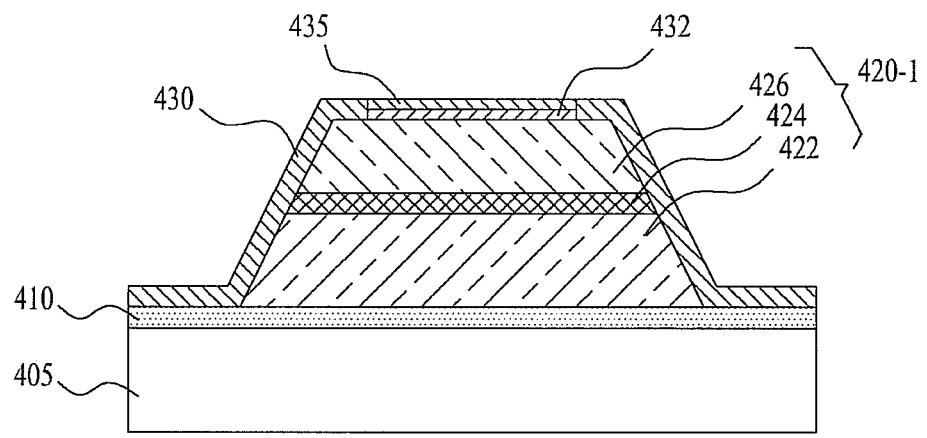

Next, as shown in FIG. 4b, the light emitting structure 420 is etched in light emitting device units. The light emitting structure 420 may be etched Inductively Coupled Plasma Reactive Ion Etching until the buffer layer 410 is exposed. A side wall of the etched light emitting structure 420-1 may be slope.

A passivation layer 430 is formed on a surface of the light emitting structure 420-1. For example, SiO2, Si3N4 or AlN is deposited on the surface of the light emitting structure 420-1 according to Plasma Chemical Vapor Phase Deposition (PECVD), to form the passivation layer 430.

Figure 4C:
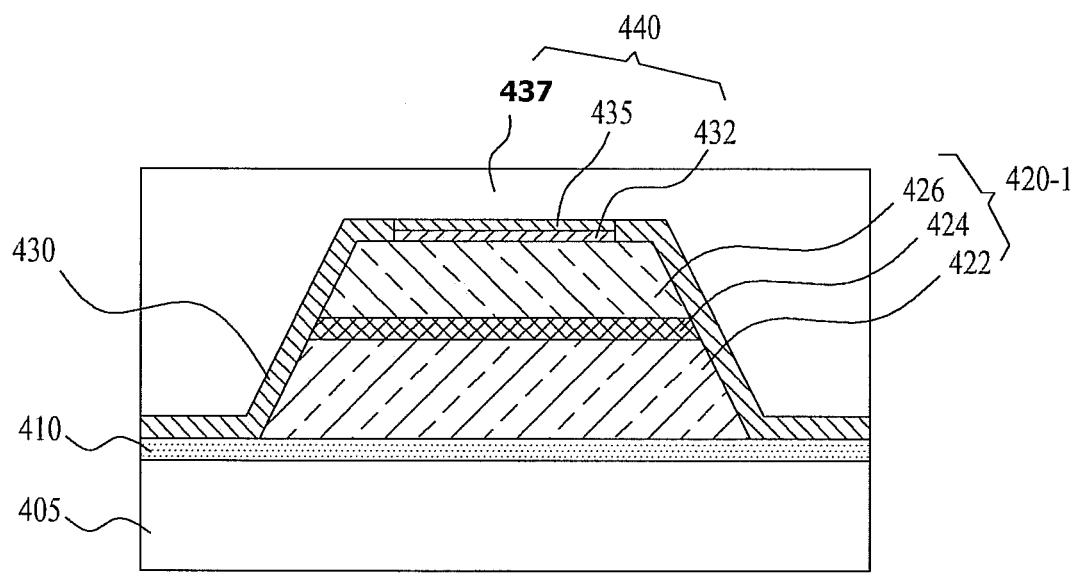

Hence, as shown in FIGS. 4b and 4c, the passivation layer 430 is etched and an opening is formed to expose an upper surface of the second conductivity type semiconductor layer 426. A second electrode layer 440 is formed on the exposed second conductivity type semiconductor layer 426. At this time, the second electrode layer 440 includes an ohmic contact layer 432, a reflective layer 435 and a supporting member 437.

The ohmic contact layer 432 is formed on a surface of the exposed second conductivity type semiconductor layer 426 to be in ohmic contact with the second conductivity type semiconductor layer 426 to allow the electric power supplied to the light emitting structure 420-1 smoothly. For example, the ohmic contact layer 432 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni/$IrO_x$/Au, Ni/$IrO_x$/Au/ITO, Pt, Ni, Au, Rh and Pd. The ohmic contact layer 432 is provided to make carriers injected into the second conductivity type semiconductor layer 426 smoothly and it may not be formed necessarily.

The reflective layer 435 is formed on the ohmic contact layer 432 to reflect the light incident thereon from the light emitting structure 420-1, to improve light extraction efficiency. The reflective layer 435 may include at least one layer formed of one material selected from Ag, Ni, Al, Rh, Pd, Ir, Ru, Mg, Zn, Pt, Au, Hf and ally of two or more of them. The reflective layer 435 is provided to improve luminous efficiency and it may not be formed necessarily.

After that, the supporting member 437 is formed on the passivation layer 430 and the reflective layer 435. For example, the supporting member 437 may be formed of a metal material such as Cu, Cr, Ni, Ag, Au, Mo, Pd, W, Cu—W and Al or a semiconductor material such as Si, Ge, GaAs, ZnO, SiC, SiGe and GaN. The supporting member 437 may be bonded to the light emitting structure 420-1 or attached as plated layer or conductive sheet.

Figure 4D:
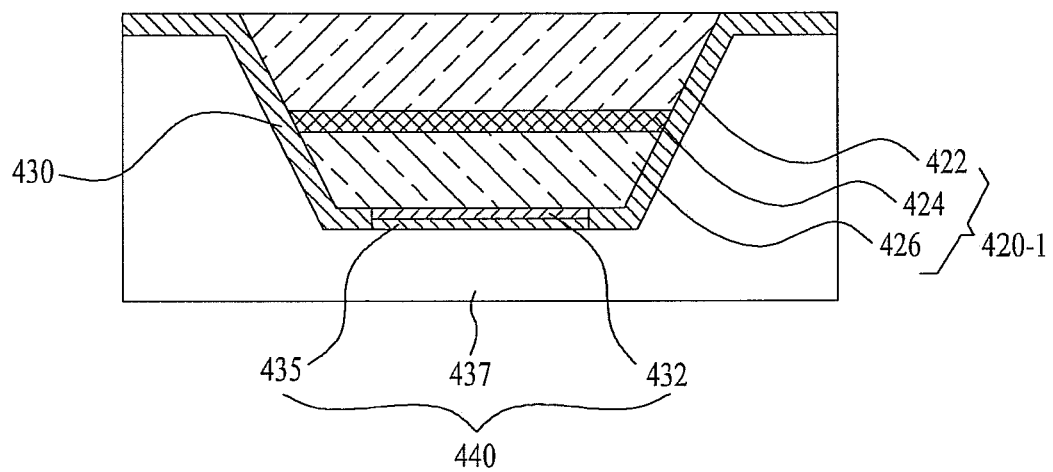
Figure 4E:
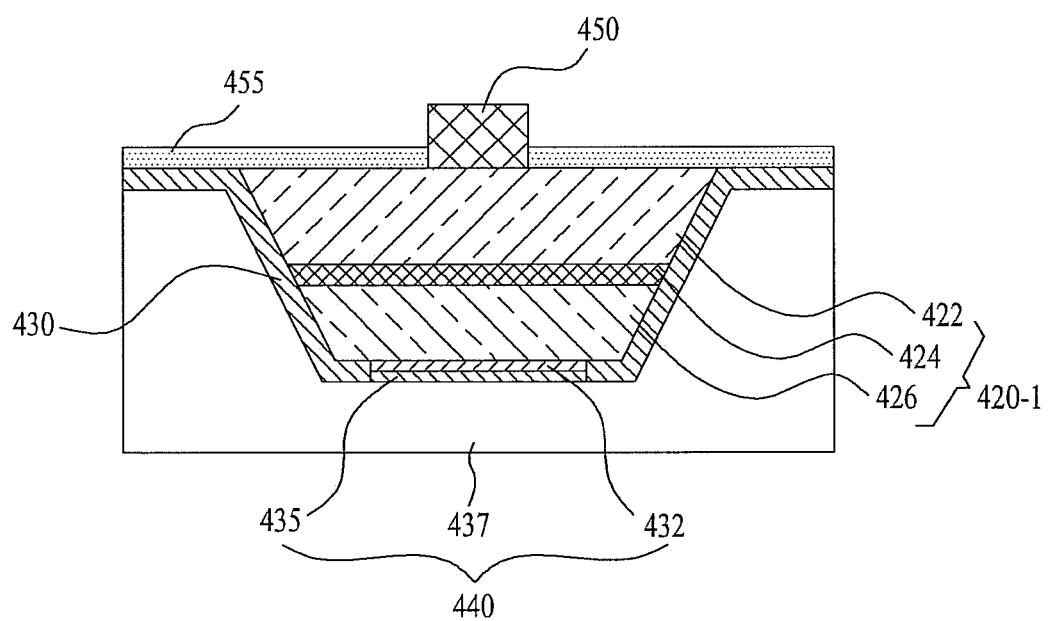
Figure 4F:
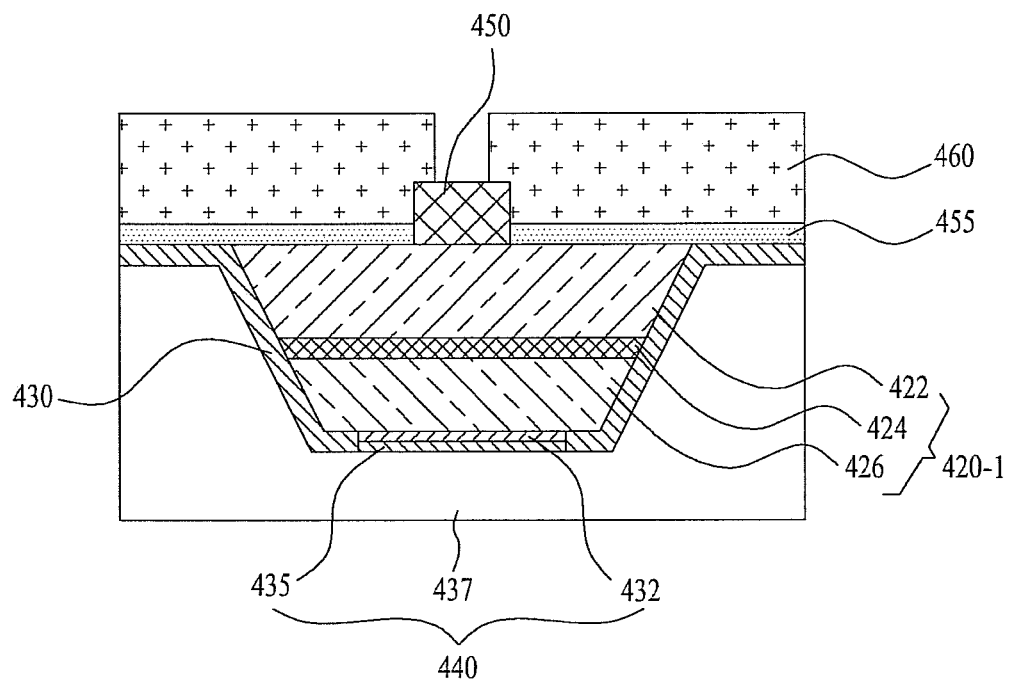

FIGS. 4d through 4f illustrate the structure shown in FIG. 4c in a state of being turned over. As shown in FIG. 4d, the substrate 405 is separated and removed from the light emitting structure 420-1 in Laser Lift Off process. The buffer layer 410 exposed after removing the substrate 405 is removed and the first conductivity type semiconductor layer 422 is exposed.

As shown in FIG. 4e, a first electrode 450 is formed on a predetermined region of a surface possessed by the first conductivity type semiconductor layer 422. A metal material such as Ti/Al, Ti/Cu and Ti/Ni is deposited in a sputtering or evaporation process and the deposited metal material is pattered, to form the first electrode 450.

An adhesive activation layer 455 is formed on a surface of the first conductivity type semiconductor layer 422 having the first electrode 450 formed thereon. For example, a nitride layer formed of a nitride based material or an oxide layer formed of a nitride based material is deposited on the surface of the first conductivity type semiconductor layer 422 having the first electrode 450 formed thereon, according to Chemical Vapor Deposition (CVD).

Figure 6A:
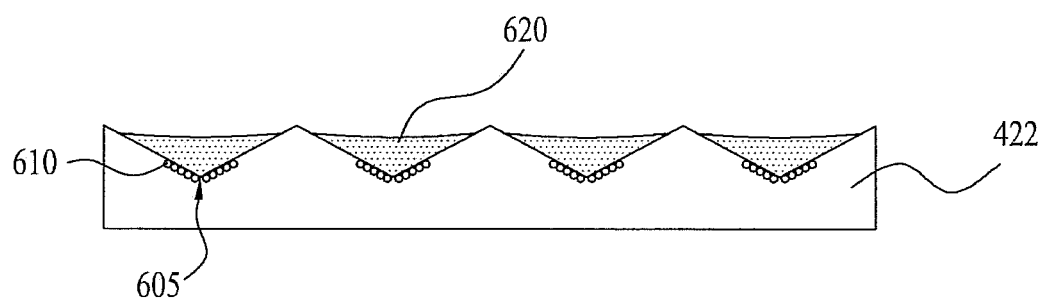
FIGS. 6a and 6b are diagrams illustrating a process of forming an adhesive activation layer.
Figure 6B:
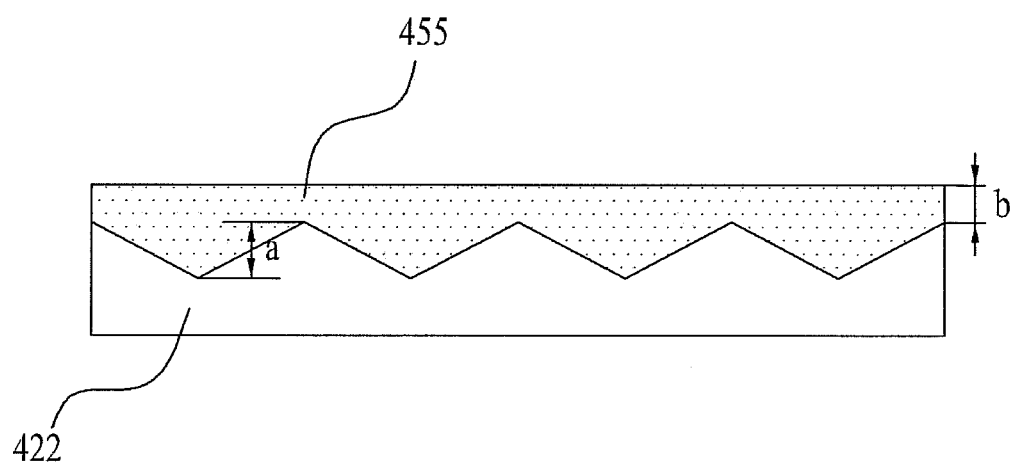

FIGS. 6a and 6b illustrate a process of forming the adhesive activation layer 455. First of all, as shown in FIG. 6a, the surface of the first conductivity type semiconductor layer 422 which is the nitride gallium based semiconductor layer, for example, GaN may have a regularly or irregularly formed roughness 601 after growing completely. In other words, an irregular roughness 601 may be formed in the surface of the first conductivity type semiconductor layer 422 after growing, or a regular or irregular roughness 601 may be formed on the surface of the first conductivity type semiconductor layer 422 on purpose, to enhance the light extraction effect.

When an oxide or nitride material, for example, $SiO_2$, $Si_3N_4$, $Al_2O_3$ and $MgFe_2$ is deposited on the surface of the first conductivity type semiconductor layer 422 where such the roughness 601 is formed, oxide or nitride may fill a concave part of the roughness 601.

Specifically, as shown in FIG. 6a, when the first conductivity type semiconductor layer 422, for example, GaN is exposed to air after growing, gallium (Ga) is out-diffused near a predetermined part 605 where polar faces of the first conductivity type semiconductor layer 422 meet each other, in other words, the concave part of the roughness 601. Because of that, gallium clusters 610 are collected near the concave part 605 of the roughness 601.

The gallium clusters 610 are used as seeds when oxide or nitride is deposited, to accelerate deposition reaction. As a result, the deposition velocity of the oxide or nitride deposited in the concave part 605 of the roughness 601 may be fast, compared with the other regions. Because of that, an air gap generated by the roughness 601 of the first conductivity type semiconductor layer 422 may be filled of the nitride or oxide based material.

Hence, as shown in FIG. 6b, after the air gap generated by the roughness 601 of the first conductivity type semiconductor layer 422 is filled with the nitride or oxide based material, a conformal adhesive activation layer 455 is coated on the surface of the first conductivity type semiconductor layer 422. As the air gap of the roughness 601 is filled with the adhesive activation layer 455, a contact area with a phosphor layer 460 formed on the adhesive activation layer 455 may increase and adhesion of the phosphor layer 460 may increase accordingly.

When the depth (a) of the concave part 605 of the roughness 601 formed on the surface of the first conductivity type semiconductor layer 422 is 7000 Å, the thickness (a+b) of the adhesive activation layer 455 deposited on the first conductivity type semiconductor layer 422 may be 1 um~3 um and the thickness (b) of the adhesive activation layer 455 from a convex part 607 of the roughness 601 may be 5000 Å~1 μm. This is because influence of stress generated by the adhesive activation layer 455 is too large if the adhesive activation layer 455 is too thick. At this time, 'b' refers to the thickness from the convex part 607 of the roughness 601.

The adhesive activation layer 455 may be formed lower than the first electrode 450. In other words, the thickness (or the height) of the adhesive activation layer 455 may be smaller than the thickness of the first electrode 450. For example, the thickness (or the height) of the first electrode 450 may be more than 3 μm and the thickness of the adhesive activation layer 455 may be 1 um~3 um.

After that, as shown in 4f, the phosphor layer 460 is formed on the adhesive activation layer 450. For example, the phosphor layer 460 is coated on the surface of the adhesive activation layer 455 in a conventional deposition process such as sputtering, electron beam evaporation, CVD or ALD. As the surface of the adhesive activation layer 455 is coated level, a surface of the phosphor layer 460 coated on the surface of the adhesive activation layer 455 may be level.

At this time, the phosphor layer 460 may be configured of a blue, green or yellow phosphor. The phosphor layer 460 is etched selectively and the first electrode 450 is exposed.

As mentioned above, the adhesive activation layer 455 may enhance the adhesion between the first conductivity type semiconductor layer 422 and the phosphor layer 460, and it prevents the air gap of the phosphor layer 460 which might be generated by the irregular roughness formed in the first conductivity type semiconductor layer 422, to reduce the loss of the lights generated in the light excitation process, which might be generated by the phosphor layer 460.

Figure 5A:
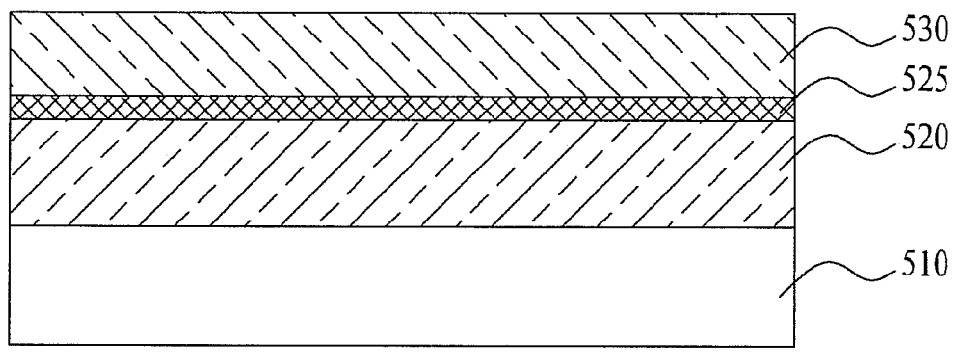
FIGS. 5a to 5c are illustrating a method of fabricating the horizontal type light emitting device according to an embodiment.
Figure 5B:
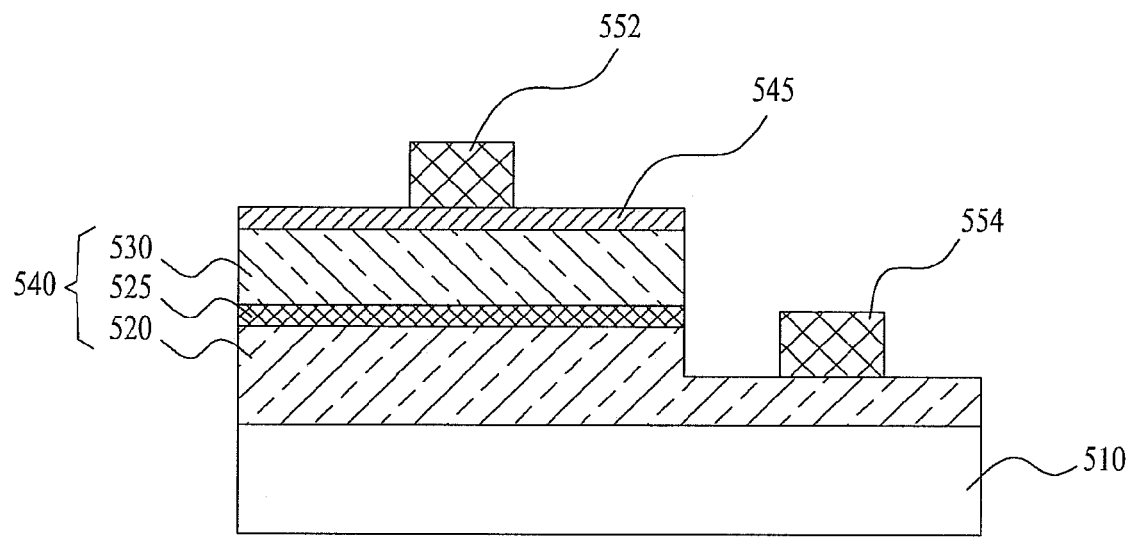
Figure 5C:
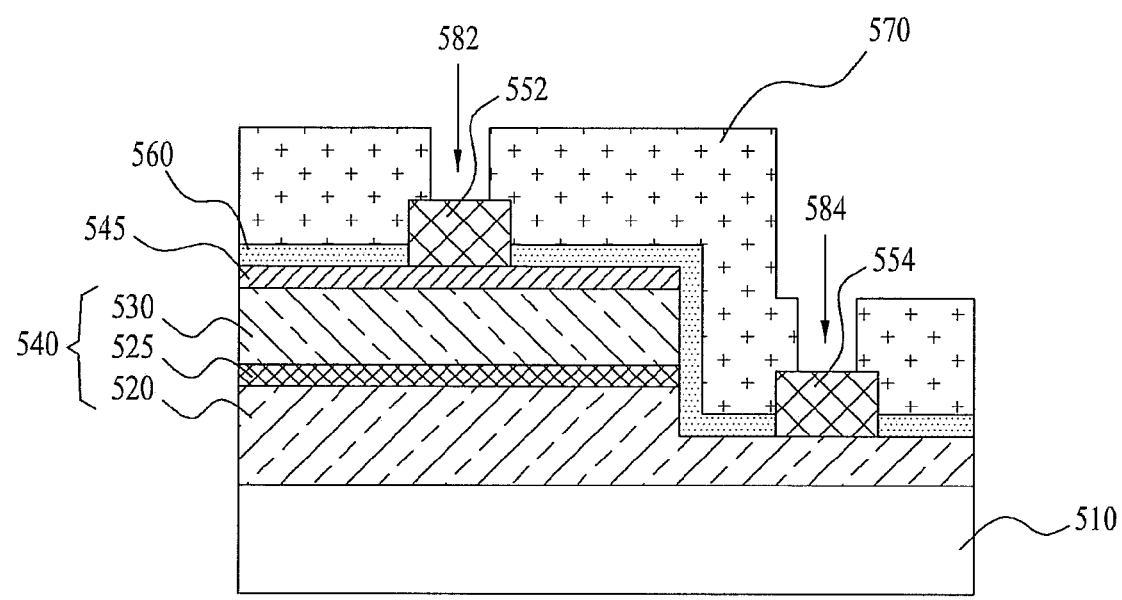

FIGS. 5a through 5c illustrate a method of a light emitting device according to another embodiment.

As shown in FIG. 5a, a first conductivity type semiconductor layer 520, an active layer 525 and a second conductivity type semiconductor layer 530 are formed on a substrate 510 sequentially. For example, on a sapphire substrate 510 may be sequentially formed an n-GaN layer 520, the active layer 520 including a GaN layer and an InGaN layer and a p-GaN layer 530. Here, a method of forming them is identical to the method described in reference to FIG. 4a.

Hence, as shown in FIG. 5b, the second conductivity type semiconductor layer 530, the active layer 525 and the first conductivity type semiconductor layer 520 are etched selectively, to expose a predetermined region of the first conductivity type semiconductor layer 520. Another predetermined region of the first conductivity type semiconductor layer 520 which is exposed by the etching may be referenced to as 'the etched region'.

After that, a conductive layer 545 is formed on an upper surface of the second conductivity type semiconductor layer 530. A second electrode 552 is formed on the conductive layer 545 and a first electrode 554 is formed on the etched region.

Hence, as shown in FIG. 5c, an adhesive activation layer 560 is formed on a surface of the conductive layer 545. At this time, the adhesive activation layer 560 may be formed even on side walls of the light emitting structure 540 and a surface of the etched region. A method of forming the adhesive activation layer 560 is identical to the method described in reference to FIG. 4e.

After that, a phosphor layer 570 is formed on a surface of the adhesive activation layer 560 and the formed phosphor layer 570 is etched selectively, to form openings 582 and 584 exposing upper surfaces of the first and second electrodes 552 and 554, respectively. A method of forming the phosphor layer 570 is identical to the method described in reference to FIG. 4f.

Figure 8:
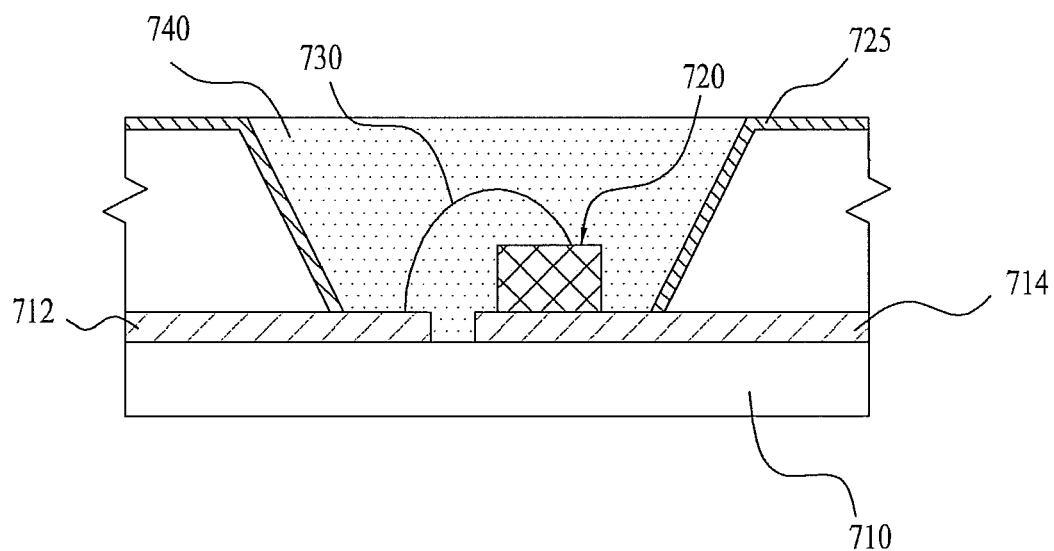
FIG. 8 is a diagram illustrating a light emitting package including the light emitting device according to an embodiment.

FIG. 8 illustrates a light emitting device package including the light emitting device according to the embodiments. In reference to FIG. 8, the light emitting device package includes a package body 710, a first metal layer 712, a second metal layer 714, a reflection sheet 725, a wire 730 and an encapsulation layer 740.

The package body 710 has cavity formed in a predetermined region thereof. Side walls of the cavity may be slope. The package body 710 may be formed of a silicon based wafer level package, a silicon substrate and a substrate formed of silicon carbide (SiC) or aluminum nitride (AlN), with good insulation or thermal conductivity. The package body 710 may be formed of a plurality of multilayered substrates. The embodiment is not limited by the materials, the structure and the shape described above.

The first and second metal layers 712 and 714 are arranged on a surface of the package body 710, with being electrically separated from each other, in consideration of heat emission or installation of the light emitting device. The light emitting device 720 is electrically connected with the first and second metal layers 712 and 714.

For example, the second electrode layer 201 of the light emitting device shown in FIG. 2 is electrically connected with the second metal layer 714. The first electrode 240 may be bonded with an end of the wire 730 and the first metal layer 712 may be bonded with the other end of the wire 730.

FIG. 8 illustrates that the light emitting device 720 mounted on the light emitting device package 700 is the light emitting device 100 shown in FIG. 2, not limited thereto. The light emitting device 200 shown in FIG. 3 may be mounted.

The reflection sheet 725 is formed the side wall of the cavity formed in the package body 710 to allow a light emitted from the light emitting device travel along a predetermined direction. The reflection sheet 725 is formed of a light reflective material, for example, a metal coating material and a metal flake.

The encapsulation layer 740 encapsulates the light emitting device 720 located in the cavity of the package body 710 to protect it from the external environment. The encapsulation layer 740 is formed of a colorless and transparent polymer resin material such as epoxy or silicon. Also, the encapsulation layer 740 may include a phosphor to vary a wavelength of the light emitted from the light emitting device 720.

According to the light emitting device and the light emitting device package according to the embodiment, the adhesive activation layer is insertedly provided between the light emitting device and the phosphor layer, to enhance the adhesion between the interfaces of the light emitting structure and the phosphor layer. As a result, the coated phosphor layer is prevented from being peeled off and the loss of the lights in the excitation process is reduced by suppressing the air gap generated in the coated phosphor layer. Activation of excitation energy for the phosphor layer may be enhanced based on physical properties of the adhesive activation layer.

The plurality of the light emitting device packages according to the embodiment may be arrayed on a substrate. A light guide plate, a prism sheet and a diffusion sheet, which are optical members, may be arranged on a light passage of the light emitting device packages.

Another embodiment may be realized by a display device, a pointing device or a lighting system, including the light emitting device or the light emitting device package described above. For example, the lighting system may include a lamp and a street lamp.

Figure 9:
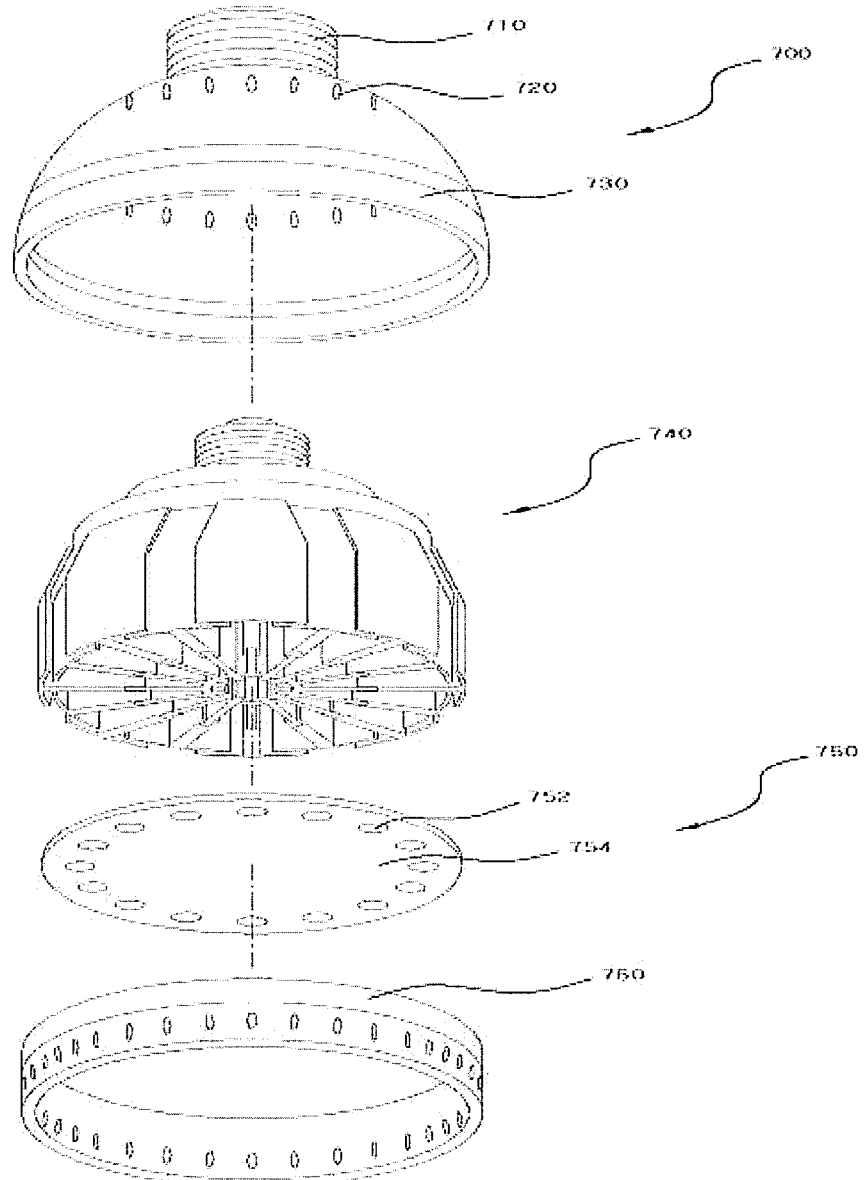
FIG. 9 is an exploded perspective view illustrating a lighting apparatus including the light emitting device package according to an embodiment.

FIG. 9 is an exploded perspective view illustrating a lighting apparatus including the light emitting device package. In reference to FIG. 9, the lighting apparatus according to the embodiment includes a lighting source 750 for projecting a light, a housing 700 where the light source 750 is mounted, a heat dissipation part 740 for dissipating heat generated from the light source 750, and a holder 760 for connecting the lighting source 750 and the heat dissipation part 740 to the housing 700.

The housing 700 includes a socket connected part 710 connected with an electric socket (not shown), a body part 730 connected with the socket connected part 710, having the lighting source 750 mounted therein. A single air hole 720 may be formed in the body part 730.

The plurality of the air holes 720 may be provided in the body part 730 of the housing 700. Other various arrangements may be possible, except the single air hole 720 or the plurality of the air holes 720 arranged in a radial direction.

The lighting source 750 is configured of a plurality of light emitting packages 752 arranged on a substrate 752. At this time, the light emitting device package 752 may be the light emitting device package shown in FIG. 2 or 3.

Here, the substrate 754 may have a predetermined shape which can be inserted in an open part of the housing 700 and it may be formed of a material having good heat conductivity to transport heat to the heat dissipation part 740, which will be described later.

The holder 760 is provided under the lighting source 750 and it may include a frame and another different air hole. Although not shown in the drawing, an optical member is provided under the lighting source 750 to diffuse, scatter or collect the lights projected from the light emitting device packages 752 of the lighting source 750.

Figure 10:
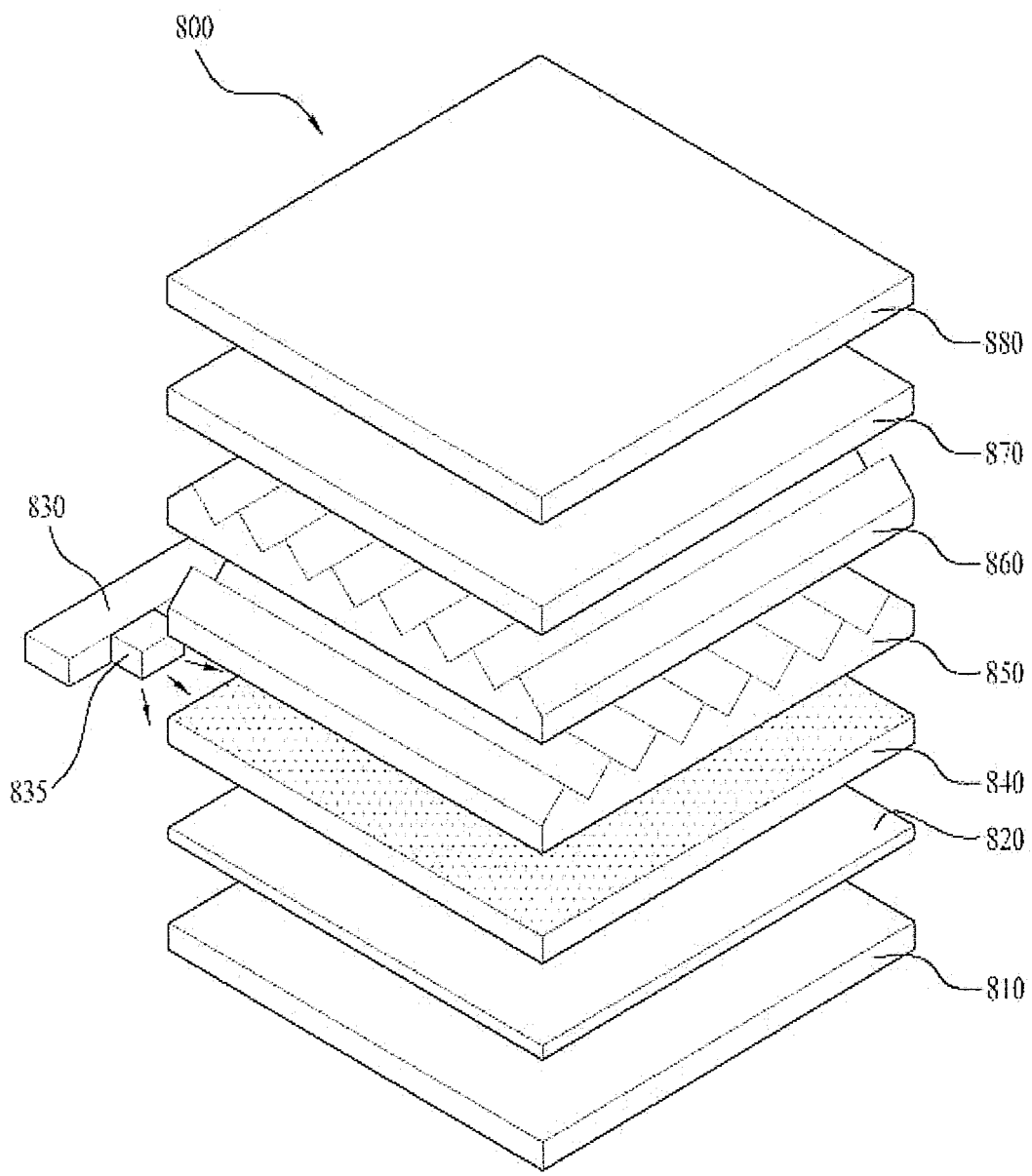
FIG. 10 is a diagram illustrating a display device including the light emitting device package according to an embodiment.

FIG. 10 is a diagram illustrating a display device including the light emitting device package according to an embodiment.

In reference to FIG. 10, the display device 800 according to this embodiment includes lighting source modules 830 and 835, a reflection sheet 820 provided on a bottom cover 810, a light guide plate 840 arranged in front of the reflection sheet 820 to guide lights emitted from the lighting source modules 830 and 835, an optical sheet having prism sheets 850 and 860 arranged in front of the light guide plate 840, a panel 870 arranged in front of the prism sheets 850 and 860, and a color filter 880 arranged in front of the panel 870. Here, the bottom cover 810, the reflection sheet 820, the lighting source modules 830 and 835, the light guide plate 840 and the optical sheet may compose a backlight unit.

The lighting source module includes a light emitting device package 835 arranged on a substrate 830. Here, the substrate 830 may be a PCB and the light emitting device package 835 may be one of the embodiments shown in FIGS. 2 and 3.

The bottom cover 810 may receive inner elements of the display device 800. The reflection sheet 820 may be an independent element as shown in the drawing or it may be a material with high reflectivity coated on a rear surface of the light guide plate 840 or a front surface of the bottom cover 810.

Here, a material which can be used as ultra-thin type with a high reflectivity may be used for the reflection sheet 820 and polyethylene terephtalate (PET) may be used to form the reflection sheet 820.

The light guide plate 830 disperses the lights to entire regions of a screen provided in a liquid crystal display device uniformly by scattering the lights emitted from the lighting source modules. Because of that, the light guide plate 830 is formed of a material with a high refractive index and a high transmissivity. The light guide plate 830 may be formed of polymethylmethacrylate (PMMA), polycarbonate (PC) or polyethylene (PE).

A first prism sheet 850 may be formed on a surface of a supporting film and the first prism sheet 850 may be formed of a polymer material having transparency and elasticity. The polymer may have a prism layer having a plurality confoimation structures formed repeatedly. Here, a plurality of patterns may be a stripe type having crests and troughs formed repeatedly.

A direction of crests and troughs formed in the surface of a supporting film provided in a second prism sheet 860 may be perpendicular to the direction of the crests and troughs formed in the surface of the supporting film provided in the first prism sheet 850. This is because the lights transported from the lighting source modules and the reflection sheets have to be dispersed to a front surface of the panel 870 uniformly.

Although not shown in the drawing, a protection sheet may be provided on each of the prism sheets. The protection sheet may include light diffusive particles and a binder arranged on both surfaces of a supporting film, respectively. The prism layer may be formed of a polymer material selected from a group of polyurethane, styrene-butadiene copolymer, polyacrylate, polymethacrylate, polymethylmethacrylate, polyethylene terephthalate elastomer, poly, polyisoprene and polysilicon.

Although not shown in the drawing, a diffusion sheet may be arranged between the light guide plate 840 and the first prism sheet 850. The diffusion sheet may be formed of polyester and polycarbonate based material, and it may widen an angle of light projection as much as possible by refraction and scattering of the lights incident from the backlight unit. The diffusion sheet includes a supporting layer having a light scatter, and first and second layers formed in a light emission surface (toward a first prism sheet direction) and a light incidence surface (toward a reflection sheet direction), respectively, without the light scatters.

According to the embodiment, the diffusion sheet, the first prism sheet 850 and the second prism sheet 860 may compose an optical sheet. Alternatively, the optical sheet may be configured of other combination, for example, a micro-lens array or combination of a diffusion sheet and a micro-lens array or combination of a single prism sheet and a micro-lens array.

A liquid crystal display may be arranged in the panel 870 and other types of display devices requiring lighting sources may be provided, except the liquid crystal display 860. The panel 870 is configured of liquid crystal located between glass bodies and a polarizing plate placed on the glass bodies to use polarization of the lights. Here, the liquid crystal has an intermediate property of liquid and solid. The liquid crystal, which is an organic molecule with liquidity, has regular arrangement like crystal. An image is displayed by using a property of the liquid crystal that the molecular arrangement is changed by an external electric field.

The liquid crystal display used in the display device may be an active matrix scheme which uses a transistor as switch for adjusting a voltage supplied to each of pixels. The color filter 880 is provided on a front surface of the panel 870 and each of the pixels transmits only red, green and blue lights out of the lights projected from the panel 870, only to display the image.

It will be apparent to those skilled in the art that various modifications and variations can be made in the embodiment without departing from the spirit or scope of the inventions. Thus, it is intended that the embodiment covers the modifications and variations of this invention provided they come within the scope of the appended claims and their equivalents.

What is claimed is:

1. A light emitting device comprising:
   a light emitting structure comprising a first semiconductor layer, an active layer, and a second semiconductor layer, with a roughness including a concave part and a convex part formed in a surface of the first semiconductor layer;
   a phosphor layer arranged on the first semiconductor layer; and
   an adhesive activation layer arranged between the first semiconductor layer and the phosphor layer, wherein the adhesive activation layer fills the concave part of the roughness, and a boundary surface between the adhesive activation layer formed on the concave part and the convex part and the phosphor layer is level.

2. The light emitting device of claim 1, wherein the adhesive activation layer is formed of an oxide based material or a nitride based material.

3. The light emitting device of claim 1, further comprising:
   a second electrode layer arranged under the light emitting structure.

4. The light emitting device of claim 1, further comprising:
   a first electrode arranged on the first semiconductor layer.

5. The light emitting device of claim 1, wherein a thickness of the adhesive activation layer from the convex part of the roughness is 5000 Å~1 µm.

6. The light emitting device of claim 1, wherein a thickness of the adhesive activation layer from the concave part of the roughness is 1 um~3 um.

7. The light emitting device of claim 1, wherein the phosphor layer is a conformal coating layer.

8. The light emitting device of claim 1, further comprising:
   a passivation layer that covers a side surface of the light emitting structure.

9. The light emitting device of claim 1, wherein a portion of the second semiconductor layer is exposed, and the light emitting device further comprises:
   a substrate located under the second semiconductor layer;
   a conductive layer arranged between the first semiconductor layer and the adhesive activation layer;
   a first electrode arranged on the exposed portion of the second semiconductor layer; and
   a second electrode arranged on the conductive layer.

10. The light emitting device of claim 2, wherein the adhesive activation layer is $SiO_2$, $Si_3N_4$, $Al_2O_3$ or $MgFe_2$.

11. The light emitting device of claim 3, wherein the second electrode layer comprises:
    a supporting member;
    a reflective layer arranged on the supporting member; and
    an ohmic contact layer located between the reflective layer and the light emitting structure.

12. The light emitting device of claim 11, wherein the first semiconductor layer is an n-type nitride semiconductor layer and the second semiconductor layer is a p-type nitride semiconductor layer.

13. The light emitting device of claim 4, wherein the adhesive activation layer is lower than the first electrode.

14. The light emitting device of claim 4, wherein an upper surface of the phosphor layer is higher than an upper surface of the first electrode.

15. The light emitting device of claim 14, wherein the phosphor layer covers the upper surface of the first electrode.

16. The light emitting device of claim 9, wherein the phosphor layer is arranged on the exposed portion of the second semiconductor layer and the adhesive activation layer is interposed between the exposed portion of the second semiconductor layer and the phosphor layer.

17. The light emitting device of claim 9, wherein the adhesive activation layer is lower than the first and second electrodes, and the phosphor layer partially covers upper surfaces of the first and second electrodes.

18. The light emitting device of claim 9, wherein the first semiconductor layer is a p-type nitride semiconductor layer and the second semiconductor layer is an n-type nitride semiconductor layer.

19. A light emitting device package, comprising:
a package body;
first and second metal layers arranged on the package body, electrically separated from each other;
a light emitting device electrically connected with the first and second metal layers; and
an encapsulation layer that encapsulates the light emitting device, wherein the light emitting device comprises:
a light emitting structure comprising a first semiconductor layer, an active layer, and a second semiconductor layer, with a roughness including a concave part and a convex part formed in a surface of the first semiconductor layer;
a phosphor layer arranged on the first semiconductor layer; and
an adhesive activation layer arranged between the first semiconductor layer and the phosphor layer, the adhesive activation layer filling the concave part of the roughness, with a boundary surface between the adhesive activation layer formed on the concave part and the convex part and the phosphor layer being level.

20. A display device, comprising:
a display panel; and
a backlight that emits a light to the display panel, the backlight comprising:
a bottom cover;
a reflection sheet arranged on the bottom cover;
a light guide plate arranged on the reflection sheet;
a lighting source that emits a light to the light guide plate, the lighting source comprising a plurality of light emitting device packages arranged on a substrate; and
an optical sheet arranged on the light guide plate, wherein each of the light emitting device package comprises:
a package body;
first and second metal layers arranged on the package body, electrically separated from each other;
a light emitting device electrically connected with the first and second metal layers; and
an encapsulation layer that encapsulates the light emitting device, wherein the light emitting device comprises:
a light emitting structure comprising a first semiconductor layer, an active layer, and a second semiconductor layer, with a roughness including a concave part and a convex part formed in a surface of the first semiconductor layer;
a phosphor layer arranged on the first semiconductor layer; and
an adhesive activation layer arranged between the first semiconductor layer and the phosphor layer, the adhesive activation layer filling the concave part of the roughness, with a boundary surface between the adhesive activation layer formed on the concave part and the convex part and the phosphor layer being level.

* * * * *